(12) United States Patent
Shakeri et al.

(10) Patent No.: US 10,714,160 B2
(45) Date of Patent: *Jul. 14, 2020

(54) WAVE PIPELINE

(71) Applicant: MICRON TECHNOLOGY, INC., Boise, ID (US)

(72) Inventors: Kaveh Shakeri, Saratoga, CA (US); Ali Feiz Zarrin Ghalam, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/531,244

(22) Filed: Aug. 5, 2019

(65) Prior Publication Data

US 2019/0355400 A1 Nov. 21, 2019

Related U.S. Application Data

(63) Continuation of application No. 15/834,315, filed on Dec. 7, 2017, now Pat. No. 10,410,698.

(51) Int. Cl.
| | |
|---|---|
| *G11C 7/22* | (2006.01) |
| *G11C 7/10* | (2006.01) |
| *G11C 16/04* | (2006.01) |
| *G11C 8/18* | (2006.01) |
| *G11C 8/06* | (2006.01) |
| *G11C 8/04* | (2006.01) |

(52) U.S. Cl.
CPC .............. *G11C 7/222* (2013.01); *G11C 7/106* (2013.01); *G11C 7/1039* (2013.01); *G11C 7/1057* (2013.01); *G11C 7/1066* (2013.01); *G11C 7/1093* (2013.01); *G11C 8/06* (2013.01); *G11C 8/18* (2013.01); *G11C 16/0483* (2013.01); *G11C 8/04* (2013.01)

(58) Field of Classification Search
CPC ...... G11C 7/222; G11C 7/1039; G11C 7/1057; G11C 7/106; G11C 7/1066; G11C 7/1093; G11C 8/06; G11C 8/18; G11C 8/04; G11C 16/0483
USPC ..................................................... 365/189.05
See application file for complete search history.

(56) References Cited

U.S. PATENT DOCUMENTS

| | | | | |
|---|---|---|---|---|
| 5,432,823 | A | 7/1995 | Gasbarro et al. | |
| 5,987,576 | A * | 11/1999 | Johnson | G11C 7/22 |
| | | | | 711/167 |
| 6,147,926 | A * | 11/2000 | Park | G11C 7/1039 |
| | | | | 365/189.05 |

(Continued)

*Primary Examiner* — Sung Il Cho

(74) *Attorney, Agent, or Firm* — Dickey, Billig & Czaja, PLLC

(57) ABSTRACT

A wave pipeline includes a plurality of data paths, a clock signal path, and a return clock signal path. Each data path includes an input node, an output node, and a data stage between the input node and the output node. Each data path has a different delay between the input node and the output node. A first data path of the plurality of data paths has a first delay and each of the other data paths of the plurality of data paths have a delay less than the first delay. The clock signal path provides a clock signal to the data stage of each data path. The return clock signal path provides a return clock signal from the data stage of the first data path. The return clock signal triggers data out of the data stage of each data path of the plurality of data paths.

20 Claims, 8 Drawing Sheets

(56) References Cited

U.S. PATENT DOCUMENTS

| | | | |
|---|---|---|---|
| 6,449,727 B1 * | 9/2002 | Toda | G06F 13/4243 711/167 |
| 6,757,779 B1 | 6/2004 | Nataraj et al. | |
| 6,891,772 B2 | 5/2005 | Demone | |
| 7,102,940 B2 | 9/2006 | Kho | |
| 7,301,831 B2 | 11/2007 | Ware | |
| 7,464,282 B1 | 12/2008 | Abdollahi-Alibeik et al. | |
| 7,543,172 B2 | 6/2009 | Kizer et al. | |
| 7,975,164 B2 | 7/2011 | Lee et al. | |
| 8,121,237 B2 | 2/2012 | Stott et al. | |
| 8,527,802 B1 * | 9/2013 | Tran | G11C 7/1006 711/1 |
| 8,595,459 B2 | 11/2013 | Ware et al. | |
| 8,775,701 B1 * | 7/2014 | Fung | G06F 1/12 365/189.011 |
| 8,988,125 B1 | 3/2015 | Ganusov et al. | |
| 9,460,803 B1 * | 10/2016 | Tang | G11C 16/26 |
| 2002/0141280 A1 * | 10/2002 | Hamamoto | G11C 7/1051 365/233.1 |
| 2002/0159303 A1 | 10/2002 | Ware et al. | |
| 2003/0065900 A1 | 4/2003 | Mes | |
| 2003/0160289 A1 * | 8/2003 | Song | G11C 7/1072 257/390 |
| 2007/0043921 A1 | 2/2007 | Kim et al. | |
| 2008/0256282 A1 * | 10/2008 | Guo | G06F 13/4239 710/305 |
| 2011/0298512 A1 | 12/2011 | Kwak | |
| 2012/0033511 A1 * | 2/2012 | Kim | G11C 7/1039 365/189.15 |
| 2012/0110368 A1 * | 5/2012 | Lee | G06F 1/08 713/601 |
| 2014/0250260 A1 | 9/2014 | Yap | |
| 2014/0286083 A1 * | 9/2014 | Shu | G11C 7/1066 365/154 |
| 2014/0286107 A1 * | 9/2014 | Ishikawa | G11C 7/1066 365/189.03 |
| 2015/0348605 A1 * | 12/2015 | Jang | G11C 7/22 365/230.02 |
| 2016/0042772 A1 * | 2/2016 | Choi | G11C 7/106 365/189.05 |

\* cited by examiner

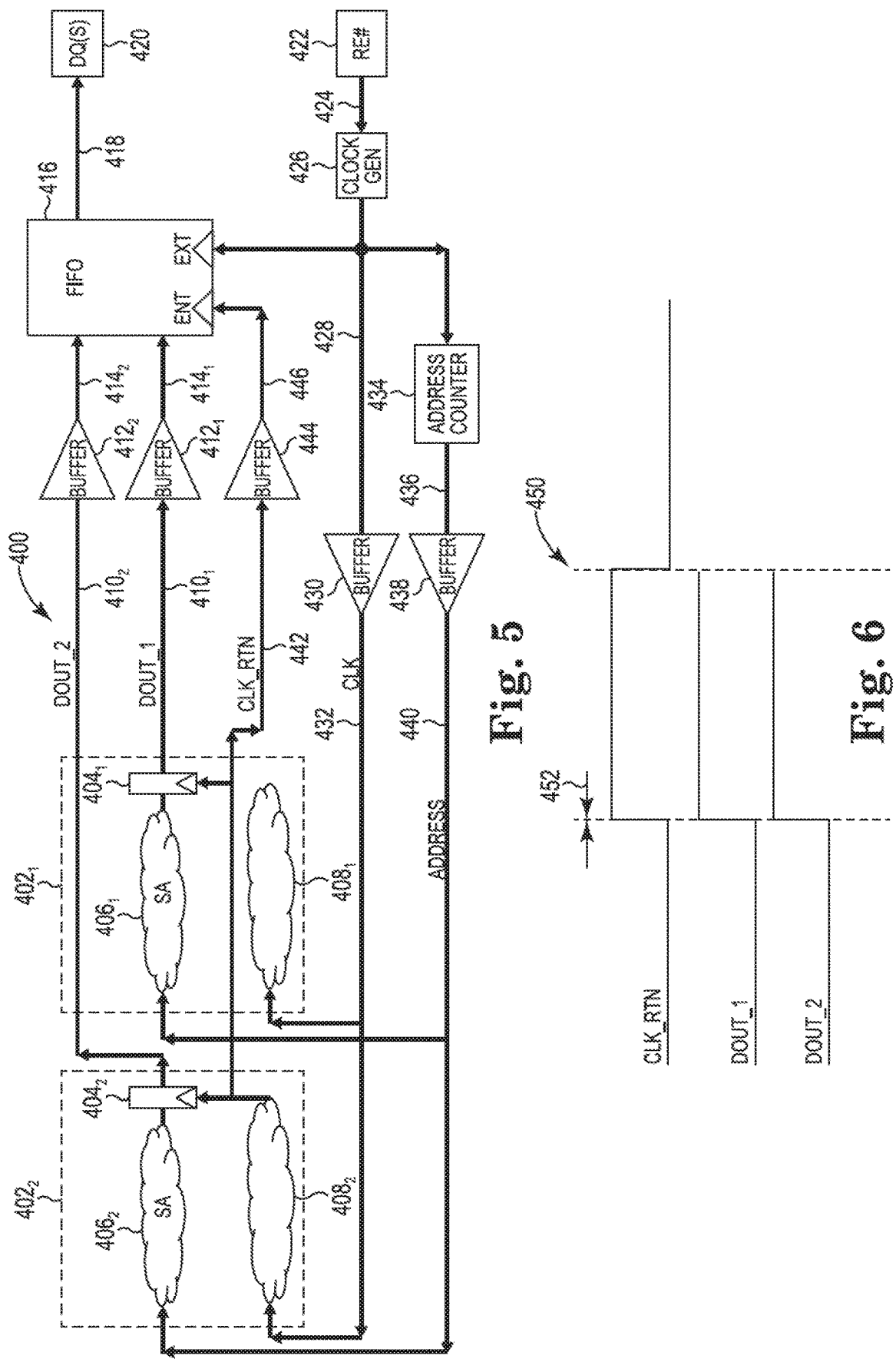

WAVE PIPELINE

RELATED APPLICATION

This Application is a Continuation of U.S. application Ser. No. 15/834,315, titled "WAVE PIPELINE," filed Dec. 7, 2017, now U.S. Pat. No. 10,410,698 on Sep. 10, 2019 which is commonly assigned and incorporated herein by reference.

TECHNICAL FIELD

The present disclosure relates generally to signal timing in integrated circuit devices. In particular, in one or more embodiments, the present disclosure relates to skew reduction for a wave pipeline in a memory device.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, tablet computers, digital cameras, digital media players, cellular telephones, solid state drives and removable memory modules, and the uses are growing.

A wave pipeline may be used in a data path to send or receive data between different parts of an integrated circuit, such as a memory device. In a wave pipeline, the data signal and the clock signal move together. Different paths for the data signal and the clock signal, however, may result in skew between the data signal and the clock signal. Skew between the data signal and the clock signal should be minimized since a large skew limits the maximum clock frequency and the maximum distance that the data signal and the clock signal may travel.

For the reasons stated above, and for other reasons stated below which will become apparent to those skilled in the art upon reading and understanding the present specification, there is a need in the art for alternative methods for reducing skew between a data signal and a clock signal in a wave pipeline, and system and apparatus to perform such methods.

BRIEF DESCRIPTION OF THE DRAWINGS

FIG. 5 is a schematic diagram illustrating another embodiment of an output data path.

FIG. 6 is a timing diagram illustrating one embodiment of the data signals and the return clock signal of the output data path described with reference to FIG. 5.

DETAILED DESCRIPTION

Figure 1:
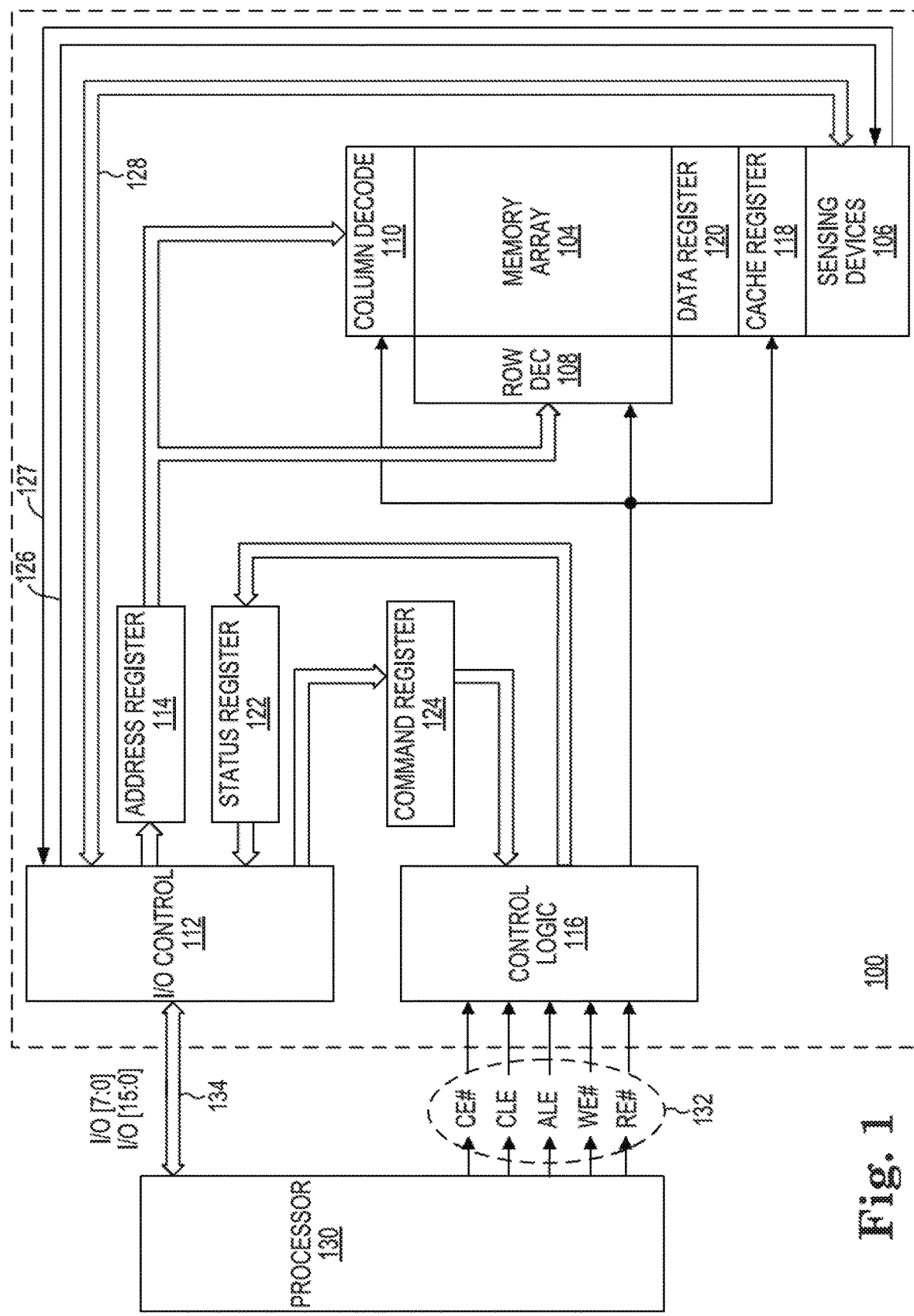
FIG. 1 is a simplified block diagram of one embodiment of a memory device in communication with a processor as part of an electronic system.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Skew is generated between different parts of data when the different parts of the data have different delays due to different paths within an integrated circuit, such as a memory device. The different paths may create different delays resulting in skew within the data and between the data and the clock signal. Accordingly, this disclosure describes embodiments for reducing skew within data and between the data and the clock signal.

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, tablet computers, digital cameras, digital media players, digital recorders, games, appliances, vehicles, wireless devices, cellular telephones and the like. The processor 130, e.g., a controller external to the memory device 100, may be a memory controller or other external host device.

Memory device 100 includes clock-data tracking that may facilitate an improved setup and hold time margin when reading data out of memory device 100. A clock signal path 126 may be routed along with a data bus 128. A return clock signal path 127 also may be routed along with the data bus 128. A clock signal on the clock signal path 126 may be used to trigger data out of the sensing devices 106 (e.g., sense amplifiers). A return clock signal on the return clock signal path 127 may be used to latch the data from the sensing devices 106 into a data latch (e.g., FIFO) of input/output (I/O) control circuitry 112 just prior to outputting the data to processor 130. By routing the clock signal and return clock signal along with the data, they may be subjected to the same logic circuitry and process, voltage, and temperature (PVT) variations as the data, and the setup and hold time margin at the data latch may be improved. It will be recognized that process variations typically experienced in fabrication will generally lead to variations in performance of circuits, even where those circuits are intended to be of the same design or otherwise provide the same functionality. Similarly, even small separations of circuits may expose those circuits to differing voltage and temperature values if measured to sufficient precision. Thus, while this disclosure seeks to mitigate the effects of such variations between clock signal paths and data paths, there is no expectation that such variations are necessarily eliminated.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes I/O control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from sensing devices 106 to the cache register 118. The data is then passed from the cache register 118 to data register 120 for transfer to the array of memory cells 104; then new data is latched in the cache register 118 from sensing devices 106, which receive the new data from the I/O control circuitry 112. During a read operation, data is passed from the cache register 118 to sensing devices 106, which pass the data to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE #, a command latch enable CLE, an address latch enable ALE, a write enable WE #, and a read enable RE #. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118 through sensing devices 106. The data are subsequently written into data register 120 for programming the array of memory cells 104. For another embodiment, cache register 118 may be omitted, and the data are written directly into data register 120 through sensing devices 106. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
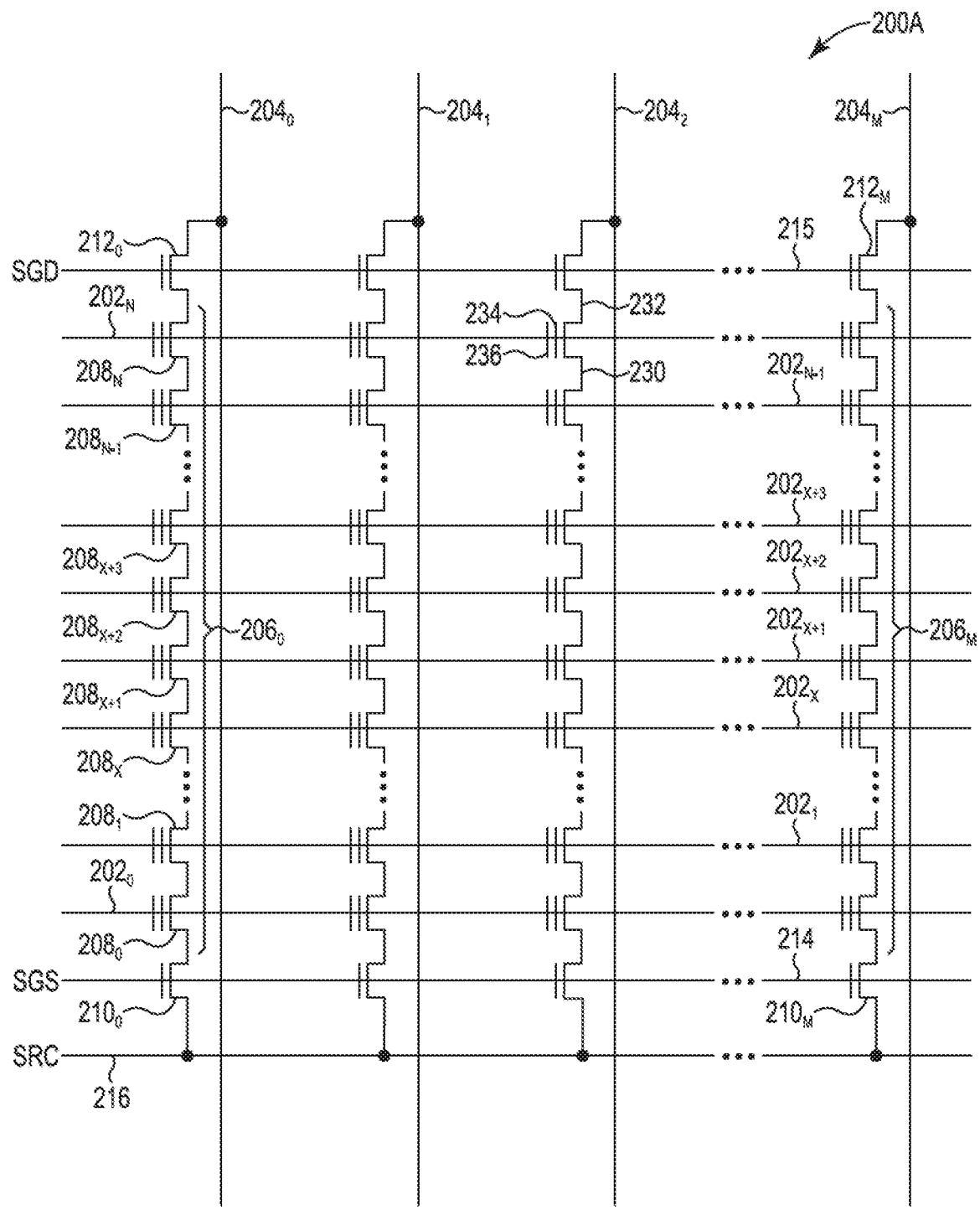
FIGS. 2A-2B are schematic diagrams of portions of an array of memory cells as could be used in a memory device of the type described with reference to FIG. 1.

FIG. 2A is a schematic of a NAND memory array 200A, e.g., as a portion of array of memory cells 104. Memory array 200A includes access lines, such as word lines $202_0$ to $202_N$, and data lines, such as bit lines $204_0$ to $204_M$. The word lines 202 may be coupled to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 2A might be a quasi-two-dimensional memory array and might have a generally planar structure, e.g., where the common source 216, strings 206 and bit lines 204 extend in substantially parallel planes. Alternatively, the memory array in FIG. 2A might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data value of the cell (e.g., through changes in threshold voltage), and a control gate 236, as shown in FIG. 2A. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2A, it is apparent from the figure that the bit lines 204 of the array of memory cells 200A may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Figure 2B:
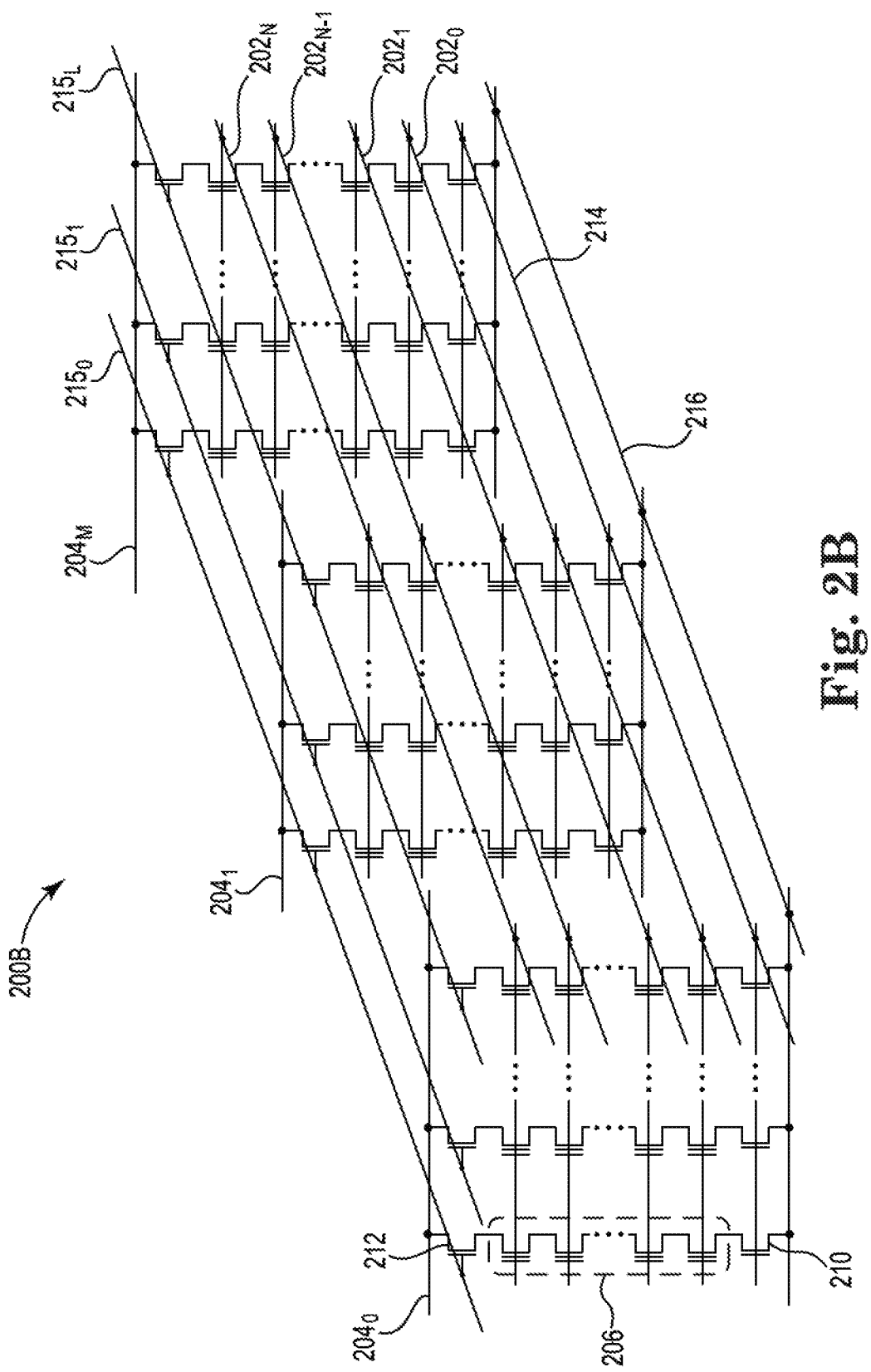

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Although the examples of FIGS. 2A and 2B are discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

Figure 3:
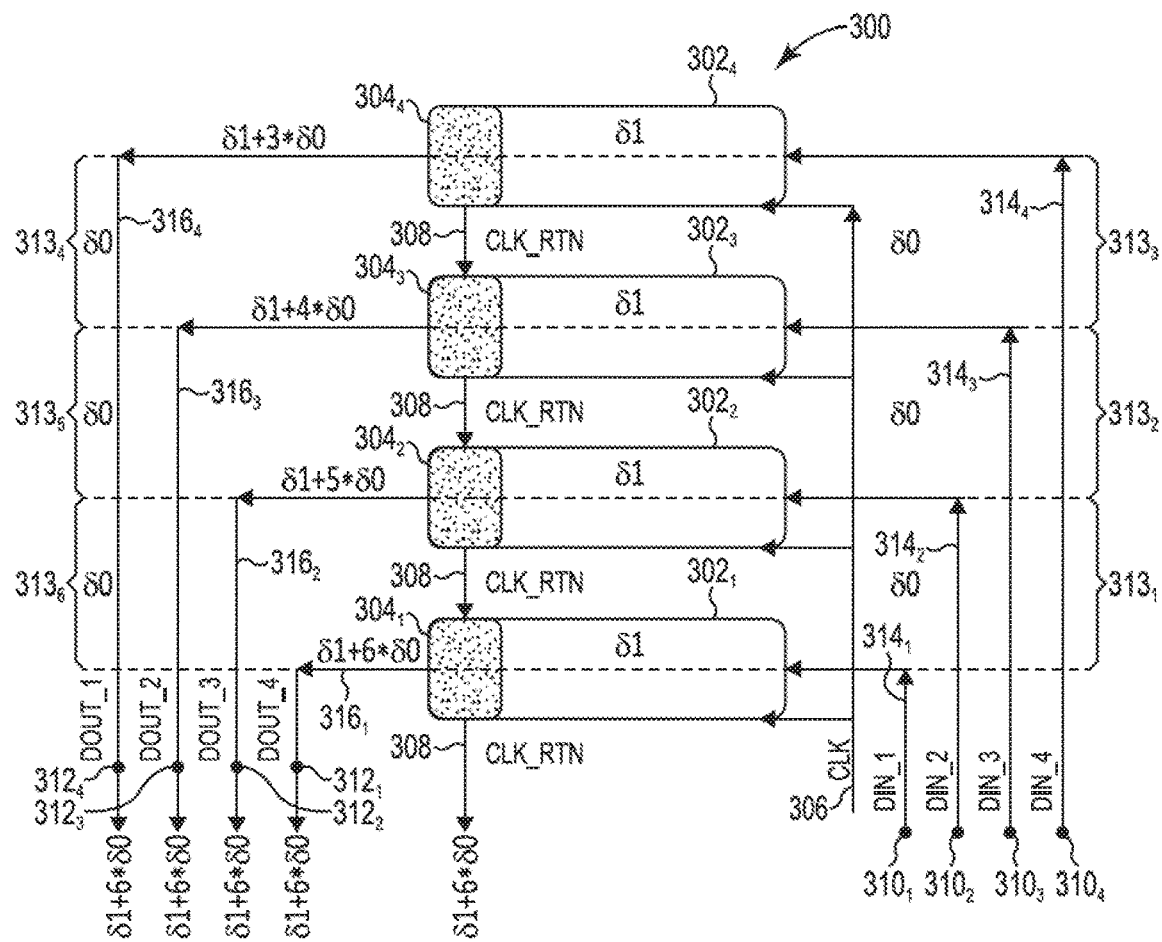
FIG. 3 is a schematic diagram illustrating one embodiment of an output data path.

FIG. 3 is a schematic diagram illustrating one embodiment of an output data path 300. In one example, output data path 300 is a portion of the memory device 100 previously described and illustrated with reference to FIG. 1. Output data path 300 may include input nodes $310_1$ to $310_4$, data stages $302_1$ to $302_4$, and output nodes $312_1$ to $312_4$. Each data stage $302_1$ to $302_4$ may be substantially similar and includes an output latch $304_1$ to $304_4$, respectively. The clock input of each data stage $302_1$ to $302_4$ is electrically coupled to a clock signal path 306. The clock input of each output latch $304_1$ to $304_4$ is electrically coupled to a return clock signal path 308. Each input node $310_1$ to $310_4$ is electrically coupled to the data input of a data stage $302_1$ to $302_4$ through a data path $314_1$ to $314_4$, respectively. The data output of each output latch $304_1$ to $304_4$ is electrically coupled to an output node $312_1$ to $312_4$ through a data path $316_1$ to $316_4$, respectively.

The delay between each input node $310_1$ to $310_4$ and the corresponding output node $312_1$ to $312_4$ may vary based on the location of the corresponding data stage $302_1$ to $302_4$ and the length of each corresponding data path $314_1$ to $314_4$ and each corresponding data path $316_1$ to $316_4$. For example, in the output data path 300 illustrated in FIG. 3, there is a delay δ0 as indicated by $313_1$ between the first data (DIN_1) on input node $310_1$ arriving at the input of first data stage $302_1$ and the second data (DIN_2) on input node $310_2$ arriving at the input of second data stage $302_2$ since data path $314_2$ is longer than data path $314_1$. There is a delay δ0 as indicated by $313_2$ between the second data on input node $310_2$ arriving at the input of second data stage $302_2$ and the third data (DIN_3) on input node $310_3$ arriving at the input of third data stage $302_3$ since data path $314_3$ is longer than data path $314_2$. There is also a delay δ0 as indicated by $313_3$ between the third data on input node $310_3$ arriving at the input of third data stage $302_3$ and the fourth data (DIN_4) on input node $310_4$ arriving at the input of fourth data stage $302_4$ since data path $314_4$ is longer than data path $314_3$. In addition, there are delays δ0 as indicated by $313_4$, $313_5$, and $313_6$ prior to output nodes $312_1$ to $312_4$ due to the different lengths of data paths $316_1$ to $316_4$. Further, each data stage $302_1$ to $302_4$ includes a delay δ1 due to data processing within each data stage $302_1$ to $302_4$. Delays $313_1$ to $313_6$ would introduce skew up to six times δ0 between the data on output nodes $312_1$ to $312_4$ if output latches $304_1$ to $304_4$ were excluded. In other examples, delays δ0 indicated at $313_1$ to $313_6$ may be different from each other.

To minimize or effectively eliminate the skew between the data on output nodes $312_1$ to $312_4$ (DOUT_1, DOUT_2, DOUT_3, and DOUT_4, respectively), the return clock signal (CLK_RTN) from the data stage of the data path having the maximum delay is used to trigger data out of each data stage. In one example, the return clock signal from the data stage of the data path having the maximum delay is used to trigger data out of each data stage in order from the data path having the maximum delay to the data path having the minimum delay. In the example of FIG. 3, the data path having the maximum delay is the combination of data path $314_4$, fourth data stage $302_4$, and data path $316_4$ between input node $310_4$ and output node $312_4$. The data path having the shortest delay is the combination of data path $314_1$, first data stage $302_1$, and data path $316_1$ between input node $310_1$ and output node $312_1$. Accordingly, the return clock signal from fourth data stage $302_4$ is used to trigger the data out of the data stages in the following order: fourth data stage $302_4$, third data stage $302_3$, second data stage $302_2$, and first data stage $302_1$. The return clock signal triggers the data out of each data stage $302_4$ to $302_1$ by triggering output latches $304_4$ to $304_1$, respectively, to pass the data from each data stage $302_4$ to $302_1$ to the corresponding data path $316_4$ to $316_1$. Therefore, the data from data stages $302_1$ to $302_4$ is aligned at output nodes $312_1$ to $312_4$ and is aligned with the return clock signal on return clock signal path 308. The data at each output node $312_1$ to $312_4$ arrives after a delay of δ1+6*δ0 from when the data arrives at each input node $310_1$ to $310_4$.

Figure 4:
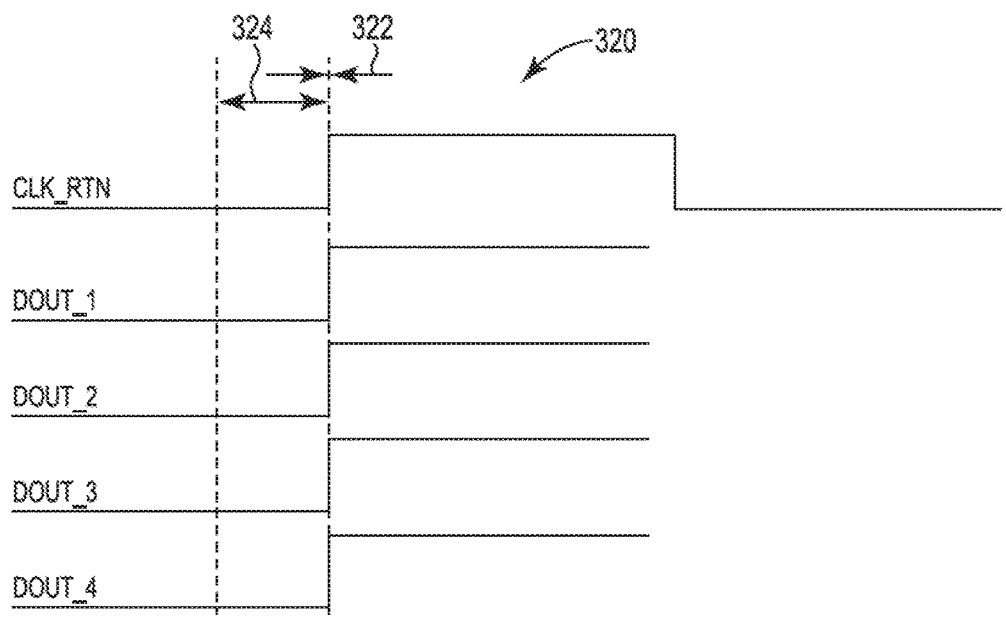
FIG. 4 is a timing diagram illustrating one embodiment of the data signals and the return clock signal of the output data path described with reference to FIG. 3.

FIG. 4 is a timing diagram 320 illustrating one embodiment of the data signals and the return clock signal of output data path 300 described with reference to FIG. 3. Timing diagram 320 includes the return clock signal (CLK_RTN) on return clock signal path 308 after output latch $304_1$, first output data (DOUT_1) on output node $312_1$, second output data (DOUT_2) on output node $312_2$, third output data (DOUT_3) on output node $312_3$, and fourth output data (DOUT_4) on output node $312_4$. As shown in FIG. 4, the skew indicated by 322 may be mitigated or effectively eliminated between the data signals and the return clock signal. Without the output latches $304_1$ to $304_4$ triggered by the return clock signal as described herein, the skew would be up to six times δ0 as indicated by 324.

FIG. 5 is a schematic diagram illustrating another embodiment of an output data path 400. In one example, output data path 400 is a portion of the memory device 100 previously described and illustrated with reference to FIG. 1. Output data path 400 may include sensing devices $402_1$ and $402_2$, buffers $412_1$, $412_2$, 430, and 438, a first in first out (FIFO) 416, data node(s) (e.g., pad(s)) DQ(s) 420, a read enable RE # clock signal node (e.g., pad) 422, a clock generator 426, and an address counter 434. While two sensing devices $402_1$ and $402_2$ are illustrated in FIG. 5, output data path 400 may include any suitable number of sensing devices. Each sensing device $402_1$ and $402_2$ includes a sense amplifier $406_1$ and $406_2$, a clock path $408_1$ and $408_2$, and an output latch $404_1$ and $404_2$, respectively.

RE # clock signal pad 422 is electrically coupled to the input of clock generator 426 through a signal path 424. An output of clock generator 426 is electrically coupled to the exit clock input (EXT) of FIFO 416, the input of buffer 430, and the input of address counter 434 through a clock signal path 428. The output of buffer 430 is electrically coupled to the input of each clock path $408_1$ and $408_2$ of each sensing device $402_1$ and $402_2$, respectively, through a clock signal path 432. The output of address counter 434 is communicatively coupled to the input of buffer 438 through an address signal path 436. Communicatively coupled components may be coupled by a single bit signal path or a multiple bit parallel signal path. The output of buffer 438 is communicatively coupled to the input of each sense amplifier $406_1$ and $406_2$ through an address signal path 440. The output of each sense amplifier $406_1$ and $406_2$ is communicatively coupled to the data input of output latch $404_1$ and $404_2$, respectively.

The output of each output latch $404_1$ and $404_2$ is communicatively coupled to the input of buffer $412_1$ and $412_2$ through a data path $410_1$ and $410_2$, respectively. The output of each buffer $412_1$ and $412_2$ is communicatively coupled to a data input of FIFO 416 through a data path $414_1$ and $414_2$, respectively. First sensing device $402_1$, data path $410_1$, buffer $412_1$ and data path $414_1$ provide a first data path, and second sensing device $402_2$, data path $410_2$, buffer $412_2$ and data path $414_2$ provide a second data path. The first data path has a first length and the second data path has a second length longer than the first length.

The output of clock path $408_2$ is electrically coupled to the clock input of each output latch $404_1$ and $404_2$ and the input of buffer 444 through a return clock signal path 442. The output of buffer 444 is electrically coupled to the entrance clock input (ENT) of FIFO 416 through a return clock signal path 446. The data output of FIFO 416 is communicatively coupled to DQ(s) 420 through a data path 418. The data width of FIFO 416 equals the data width of data paths $414_1$ and $414_2$. FIFO 416 may have any suitable number of stages based on the particular configuration of the memory device.

In one example, DQ(s) 420 is a single data pad, and data paths $410_1$ and $410_2$ and $414_1$ and $414_2$ are corresponding single bit data paths. In other examples, DQ(s) 420 are multiple data pads (e.g., eight data pads, sixteen data pads), and data paths $410_1$ and $410_2$ and $414_1$ and $414_2$ are multiple bit parallel data paths. A serializer (not shown) may be included on data path 418 between FIFO 416 and each DQ 420 to serialize parallel data from FIFO 416 for output on DQ(s) 420. In this case, the data width of FIFO 416 and data paths $414_1$ and $414_2$ may be a multiple of the number of DQ(s) 420. For example, for four DQs 420 and an eight bit serializer for each DQ 420, the data width of FIFO 416 and data paths $414_1$ and $414_2$ is 32 bits for a double data rate (DDR) memory.

Clock generator 426 receives the RE # clock signal and generates a clock signal on clock signal path 428. In one example, clock generator 426 reduces the clock rate of the RE # clock signal so that the data throughput on data paths 414₁ and 414₂ is equal to the number of DQs 420. For example, for eight DQs 420 and a data width of 8×8=64 bits, clock generator 426 divides the RE # clock signal by four to provide the clock signal on clock signal path 428. The internal data bus is clocked by a single edge per cycle of the divided-down clock while the serializers and DQs are clocked by both edges per RE # clock cycle. The reduced clock rate for the internal data bus may be used to relax the internal timing requirements. The more reduced the internal clock rate, however, the wider the internal data bus generally needs to be to maintain the data throughput. Since a wider data bus may add layout cost and design complexity, however, there is a tradeoff between the data bus width and the internal clock rate.

Buffer 430 may delay the clock signal on clock signal path 428 to provide the clock signal (CLK) on clock signal path 432. Address counter 434 generates an address signal for first sensing device 402₁ and second sensing device 402₂ in response to the clock signal on clock signal path 428. Address counter 424 provides the address signal on address signal path 436. Buffer 438 may delay the address signal on address signal path 436 to provide the address signal (ADDRESS) on address signal path 440. The clock signal on clock signal path 432 may be routed along with the address signal on address signal path 440 such that both the clock signal and the address signal are subjected to substantially the same delay (e.g., the same delay) due to the routing and PVT variations. The delay of buffers 430 and 438 may be adjusted to improve the alignment of the clock signal with the address signal.

First sensing device 402₁ senses first data from an array of memory cells (e.g., memory array 104 of FIG. 1) based on the address signal on address signal path 440 in response to the clock signal on clock signal path 432. Likewise, second sensing device 402₂ senses second data from the array of memory cells based on the address signal on address signal path 440 in response to the clock signal on clock signal path 432. In particular, sense amplifier 406₂ provides the second data to output latch 404₂ in response to the clock signal in clock path 408₂. The output of clock path 408₂ provides the return clock signal on return clock signal path 442. Clock path 408₂ provides the return clock signal (CLK_RTN) since the data path between second sensing device 402₂ and FIFO 416 is longer than the data path between first sensing device 402₁ and FIFO 416. Therefore, the data path between second sensing device 402₂ and FIFO 416 has the greatest delay. Output latch 404₂ is triggered by the return clock signal to pass the second data (DOUT_2) from sense amplifier 406₂ to data path 410₂. Since the return clock signal is used to output the second data from sensing devices 402₂, the return clock signal is aligned with the second data. With the data aligned with the return clock signal, the data is expected to be valid at a corresponding transition of the corresponding clock cycle of the return clock signal. The second data on data path 410₂ may be delayed by buffer 412₂ to provide the second data on data path 414₂.

Sense amplifier 406₁ provides the first data to output latch 404₁ in response to the clock signal in clock path 408₁. The clock signal is terminated after clock path 408₁ since clock path 408₂ provides the return clock signal. Output latch 404₁ is triggered by the return clock signal to pass the first data (DOUT_1) from sense amplifier 406₁ to data path 410₁. Since the return clock signal is used to output the first data from sensing devices 402₁, the return clock signal is aligned with the first data. The first data on data path 410₁ may be delayed by buffer 412₁ to provide the first data on data path 414₁. The return clock signal on return clock signal path 442 may be delayed by buffer 444 to provide the return clock signal on return clock signal path 446.

The return clock signal on return clock signal path 442 may be routed along with the second data on data path 410₂ from second sensing device 402₂ to first sensing device 402₁, where the return clock signal on return clock signal path 442 may then be routed along with both the second data on data path 410₂ and the first data on data path 410₁ such that the return clock signal, the second data, and the first data are subjected to substantially the same delay (e.g., the same delay) due to the routing and PVT variations. The delay of buffers 412₂, 412₁, and 444 may be adjusted to improve the alignment of the return clock signal with the first data and the second data. The return clock signal at the ENT input of FIFO 416 triggers the latching of the data at the input of FIFO 416 (i.e., DOUT_1 and DOUT_2) into FIFO 416. The clock signal on clock signal path 428 clocks data out of FIFO 416 to DQ(s) 420.

FIG. 6 is a timing diagram 450 illustrating one embodiment of the data signals and the return clock signal of output data path 400 described with reference to FIG. 5. Timing diagram 450 includes the return clock signal (CLK_RTN) on return clock signal path 442, first data (DOUT_1) on data path 410₁, and second data (DOUT_2) on signal path 410₂. As indicted in FIG. 6, the skew indicated by 452 may be mitigated or effectively eliminated between the data signals and the return clock signal due to triggering output latches 404₁ and 404₂ in response to the return clock signal from second sensing device 402₂, which has the longest delay.

Figure 7:
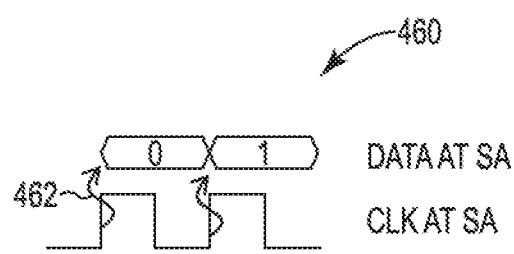
FIG. 7 is a timing diagram illustrating one embodiment of the triggering of data out of a sense amplifier of the output data path described with reference to FIG. 5.

FIG. 7 is a timing diagram 460 illustrating one embodiment of the triggering of data out of a sense amplifier of output data path 400 described with reference to FIG. 5. Timing diagram 460 illustrates the data at a sense amplifier, such as sense amplifier 406₁ or 406₂, and the clock signal at the sense amplifier. As indicated at 462, the rising edge of the clock signal may trigger the data out of the sense amplifier to provide the data to an output latch, such as output latch 404₁ or 404₂, respectively.

Figure 8:
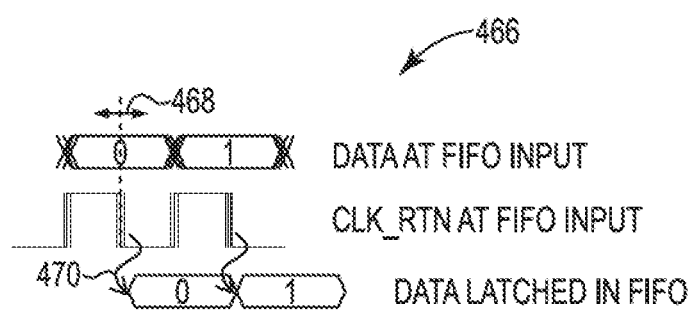
FIG. 8 is a timing diagram illustrating one embodiment of the latching of data into the FIFO of the output data path described with reference to FIG. 5.

FIG. 8 is a timing diagram 466 illustrating one embodiment of the latching of data into FIFO 416 of output data path 400 described with reference to FIG. 5. Timing diagram 466 illustrates the data at the input of FIFO 416, the return clock signal at the ENT input of FIFO 416, and the data latched in FIFO 416. The setup and hold time margin for the data at the data input of FIFO 416 is indicated at 468. As indicated at 470, the falling edge of the return clock signal may latch the data into FIFO 416. By using the falling edge of the return clock signal to latch the data into FIFO 416, the maximum setup and hold time indicated at 468 may be inherently provided since the falling edge of the return clock signal may be automatically located at the center of the data eye opening. Thus, any timing window loss at the FIFO input due to the variation of the rising edge shift delay may be mitigated or eliminated.

Figure 9:
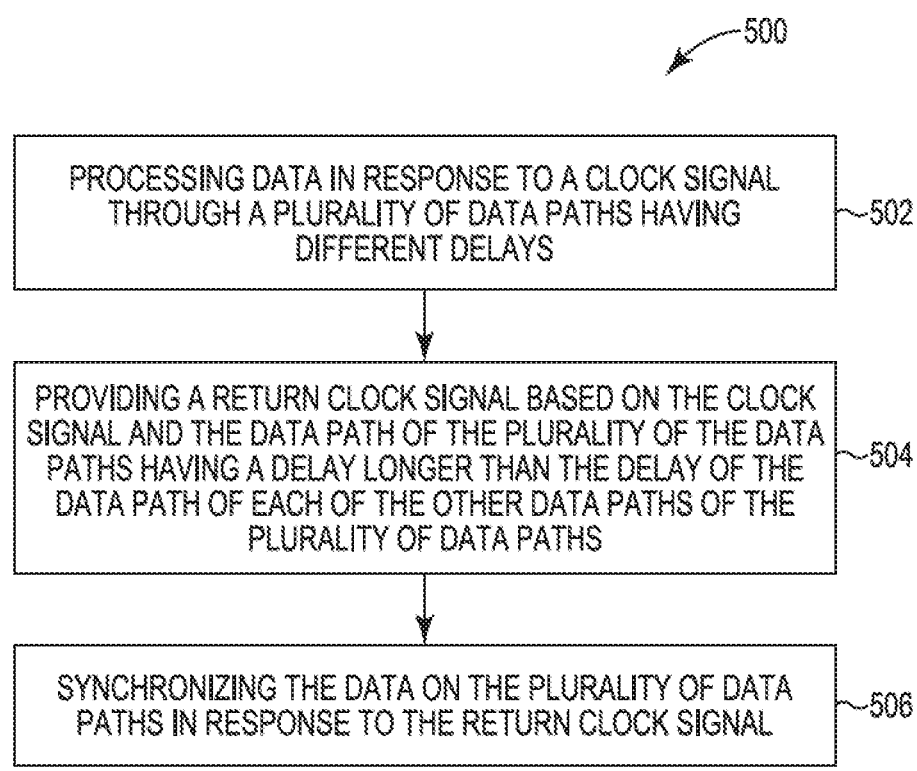
FIG. 9 is a flow diagram illustrating one embodiment of a method for processing data through a wave pipeline.

FIG. 9 is a flow diagram illustrating one embodiment of a method 500 for processing data through a wave pipeline. At 502, method 500 includes processing data in response to a clock signal through a plurality of data paths having different delays. At 504, method 500 includes providing a return clock signal based on the clock signal and the data path of the plurality of data paths having a delay longer than the delay of the data path of each of the other data paths of the plurality of data paths. At 506, method 500 includes synchronizing the data on the plurality of data paths in response to the return clock signal. In one example, synchronizing the data on the plurality of data paths includes outputting data from a data stage of each of the plurality of data paths in response to the return clock signal. In another example, synchronizing the data on the plurality of data paths includes outputting data from the data stage of each of the plurality of data paths in order from the data path having a maximum delay to the data path having a minimum delay. Method 500 may further include latching the data on the plurality of data paths into a data latch in response to the return clock signal.

Figure 10:
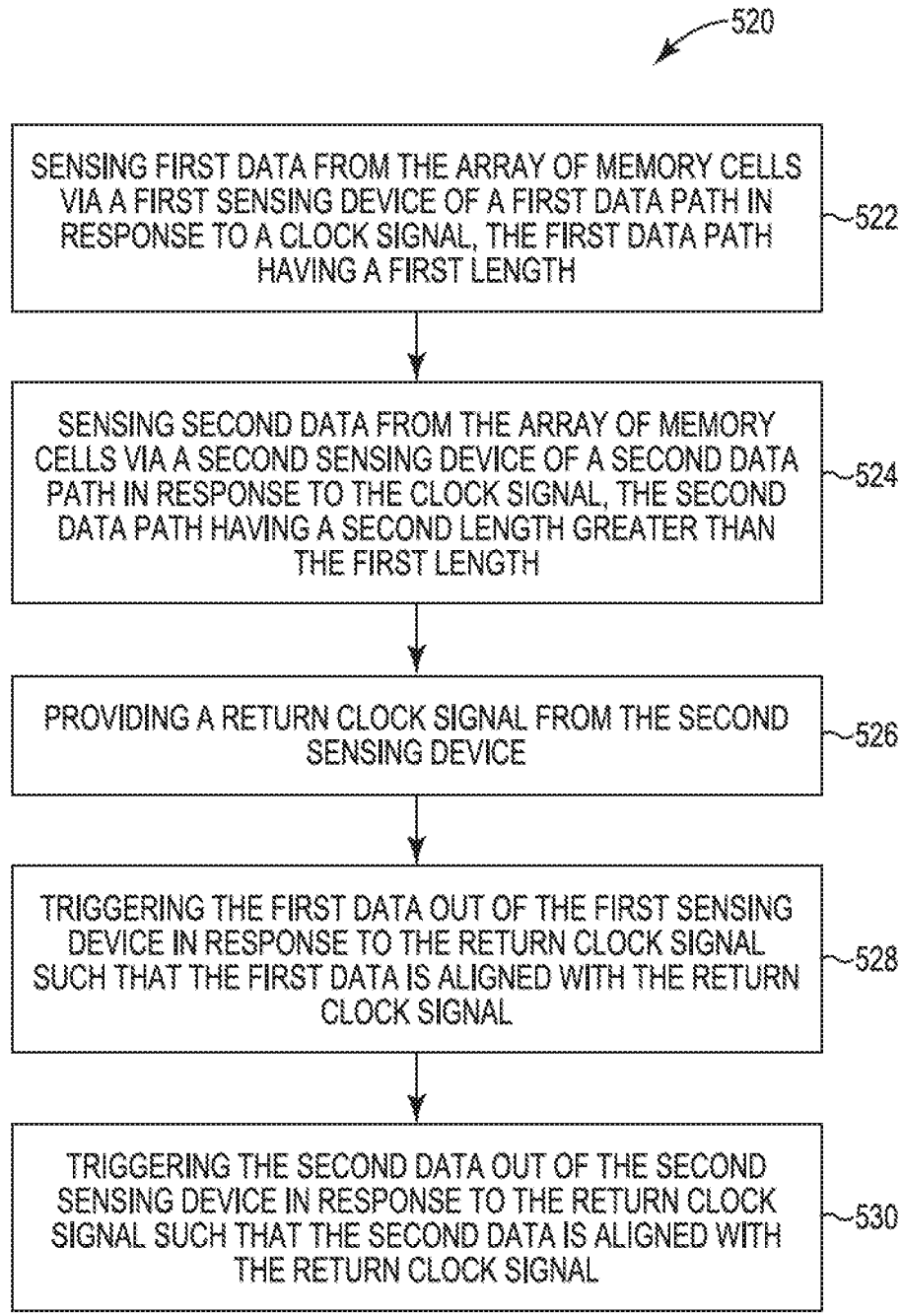
FIG. 10 is a flow diagram illustrating one embodiment of a method for reading data from an array of memory cells.

FIG. 10 is a flow diagram illustrating one embodiment of a method 520 for reading data from an array of memory cells. At 522, method 520 includes sensing first data from the array of memory cells via a first sensing device of a first data path in response to a clock signal, the first data path having a first length. At 524, method 520 includes sensing second data from the array of memory cells via a second sensing device of a second data path in response to the clock signal, the second data path having a second length greater than the first length. At 526, method 520 includes providing a return clock signal from the second sensing device. At 528, method 520 includes triggering the first data out of the first sensing device in response to the return clock signal such that the first data is aligned with the return clock signal. At 520, method 520 includes triggering the second data out of the second sensing device in response to the return clock signal such that the second data is aligned with the return clock signal.

Method 520 may further include latching the first data output from the first sensing device and the second data output from the second sensing device into a data latch in response to a falling edge of the return clock signal. In addition, method 520 may include triggering the data out of the data latch onto a data node in response to the clock signal. Further, method 520 may include generating the clock signal in response to a read enable signal. Method 520 may also include generating an address signal for the first sensing device and the second sensing device in response to the clock signal. In another example, method 520 includes buffering the address signal and buffering the clock signal such that the buffered clock signal is aligned with the buffered address signal. In yet another example, method 520 further includes buffering the first data output from the first sensing device, buffering the second data output from the second sensing device, and buffering the return clock signal such that the buffered return clock signal is aligned with the buffered first data and the buffered second data.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:
1. A memory comprising:
an array of memory cells;
a clock signal path to provide a clock signal;
a plurality of data paths each comprising a sensing device to sense data from the array of memory cells in response to the clock signal, each data path of the plurality of data paths having a different length, and a first data path of the plurality of data paths having a first length and each of the other data paths of the plurality of data paths having a length shorter than the first length; and
a single return clock signal path to provide a single return clock signal initiated at the sensing device of the first data path of the plurality of data paths, the single return clock signal to trigger data out of the sensing device of each data path of the plurality of data paths to align the data out of the sensing device of each data path of the plurality of data paths with the single return clock signal.

2. The memory of claim 1, wherein the first length corresponds to a maximum length of the plurality of data paths, and
wherein the single return clock signal triggers data out of the sensing device of each data path of the plurality of data paths in order from the first data path having the maximum length of the plurality of data paths to the data path having a minimum length of the plurality of data paths to align the data out of each sensing device of the plurality of data paths with the data out from each other sensing device of the plurality of data paths.

3. The memory of claim 1, further comprising:
a FIFO to latch the data output from each sensing device of the plurality of data paths into the FIFO in response to the single return clock signal on the single return clock signal path.

4. The memory of claim 3, further comprising:
data nodes,
wherein the FIFO outputs data to the data nodes in response to the clock signal on the clock signal path.

5. The memory of claim 1, wherein a delay of each sensing device of the plurality of data paths are equal.

6. The memory of claim 1, further comprising:
a clock generator to generate the clock signal on the clock signal path.

7. The memory of claim 1, further comprising:
an address signal path to provide an address signal to each sensing device of the plurality of data paths.

8. The memory of claim 7, further comprising:
an address counter to generate the address signal on the address signal path.

9. A memory comprising:
a clock signal path to provide a clock signal;
an address signal path to provide an address signal;
a return clock signal path to provide a return clock signal;
a first sensing device comprising a first sense amplifier, a first clock path, and a first output latch, an input of the first sense amplifier coupled to the address signal path, an output of the first sense amplifier coupled to a data input of the first output latch, an input of the first clock path coupled to the clock signal path, and an output of the first clock path coupled to a clock input of the first output latch and the return clock signal path; and
a second sensing device comprising a second sense amplifier, a second clock path, and a second output latch, an input of the second sense amplifier coupled to the address signal path, an output of the second sense amplifier coupled to a data input of the second output latch, an input of the second clock path coupled to the clock signal path, an output of the second clock path is terminated, and a clock input of the second output latch coupled to the return clock signal path.

10. The memory of claim 9, further comprising:
data nodes; and
a FIFO having a first data input coupled to a data output of the first output latch, a second data input coupled to a data output of the second output latch, an entrance clock input coupled to the return clock signal path, an exit clock input coupled to the clock signal path, and a data output coupled to the data nodes.

11. The memory of claim 10, further comprising:
a first buffer coupling the data output of the first output latch to the first data input of the FIFO;
a second buffer coupling the data output of the second output latch to the second data input of the FIFO; and
a third buffer coupling the output of the first clock path to the entrance clock input of the FIFO.

12. The memory of claim 9, further comprising:
a clock generator having an output coupled to the clock signal path, the clock generator to receive a read enable signal and generate the clock signal based on the read enable signal.

13. The memory of claim 12, wherein the clock signal path between the output of the clock generator and the input of the first clock path is longer than the clock signal path between the output of the clock generator and the input of the second clock path.

14. The memory of claim 12, further comprising:
a buffer coupling the output of the clock generator to the input of the first clock path and the input of the second clock path.

15. The memory of claim 9, further comprising:
an address counter having an output coupled to the address signal path, the address counter to generate the address signal.

16. The memory of claim 15, wherein the address signal path between the output of the address counter and the input of the first sense amplifier is longer than the address signal path between the output of the address counter and the input of the second sense amplifier.

17. The memory of claim 15, further comprising:
a buffer coupling the output of the address counter to the input of the first sense amplifier and the input of the second sense amplifier.

18. A method for reading data from an array of memory cells, the method comprising:
sensing first data from the array of memory cells via a first sense amplifier of a first data path in response to a clock signal to a first clock path corresponding to the first sense amplifier, the first data path having a first length;
sensing second data from the array of memory cells via a second sense amplifier of a second data path in response to the clock signal to a second clock path corresponding to the second sense amplifier, the second data path having a second length greater than the first length;
providing a single return clock signal from an output of the second clock path;
terminating the clock signal at an output of the first clock path;
outputting the first data from the first sense amplifier to a first output node of the first data path in response to the single return clock signal such that the first data is aligned with the single return clock signal; and
outputting the second data from the second sense amplifier to a second output node of the second data path in response to the single return clock signal such that the second data is aligned with the first data and the single return clock signal.

19. The method of claim 18, further comprising:
latching the first data on the first output node and the second data on the second output node into a FIFO in response to the single return clock signal.

20. The method of claim 19, further comprising:
outputting the data from the FIFO to data nodes in response to the clock signal.

* * * * *